(12) United States Patent
Etori et al.

(10) Patent No.: US 8,552,089 B2
(45) Date of Patent: Oct. 8, 2013

(54) INK COMPOSITION FOR FORMING LIGHT SHIELDING FILM OF ORGANIC SEMICONDUCTOR DEVICE, METHOD FOR FORMING LIGHT SHIELDING FILM, AND ORGANIC TRANSISTOR DEVICE HAVING LIGHT SHIELDING FILM

(75) Inventors: Hideki Etori, Sakura (JP); Hiroshi Isozumi, Tokyo (JP); Masanori Kasai, Tokyo (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/000,918

(22) PCT Filed: Apr. 26, 2010

(86) PCT No.: PCT/JP2010/057335
§ 371 (c)(1),
(2), (4) Date: Dec. 22, 2010

(87) PCT Pub. No.: WO2010/125993
PCT Pub. Date: Nov. 4, 2010

(65) Prior Publication Data
US 2012/0032309 A1 Feb. 9, 2012

(30) Foreign Application Priority Data

Apr. 27, 2009 (JP) ................................. 2009-107662

(51) Int. Cl.
| | | |
|---|---|---|
| A61K 9/16 | (2006.01) | |
| B05D 5/12 | (2006.01) | |
| B60C 1/00 | (2006.01) | |
| C04B 26/12 | (2006.01) | |
| C08G 18/08 | (2006.01) | |
| C08G 18/28 | (2006.01) | |
| C08G 18/42 | (2006.01) | |
| C08G 59/50 | (2006.01) | |
| C08G 63/00 | (2006.01) | |
| C08G 64/16 | (2006.01) | |
| C08G 67/02 | (2006.01) | |
| C08G 69/00 | (2006.01) | |
| C08K 3/10 | (2006.01) | |
| C08K 3/22 | (2006.01) | |
| C08K 5/01 | (2006.01) | |
| C08K 5/24 | (2006.01) | |
| C08K 5/54 | (2006.01) | |
| C08L 51/00 | (2006.01) | |
| C08L 53/00 | (2006.01) | |
| C08L 61/00 | (2006.01) | |
| C08L 75/00 | (2006.01) | |
| C09D 5/00 | (2006.01) | |
| C09D 11/00 | (2006.01) | |
| G02B 5/22 | (2006.01) | |
| G02F 1/00 | (2006.01) | |
| H01C 17/06 | (2006.01) | |
| H04N 5/70 | (2006.01) | |

(52) U.S. Cl.
USPC ........... 523/160; 348/801; 359/321; 359/885; 427/58; 427/96.3; 523/161; 523/400; 524/261; 524/263; 524/413; 524/474; 524/507; 524/539; 524/543; 524/590; 524/594; 524/611; 524/612

(58) Field of Classification Search
USPC ................. 523/160, 161, 400; 524/261, 263, 524/413, 474, 507, 539, 543, 590, 594, 611, 524/612; 427/58, 96.3; 348/801; 359/321, 359/885

See application file for complete search history.

(56) References Cited

U.S. PATENT DOCUMENTS
2007/0120923 A1   5/2007   Kovacs et al.

FOREIGN PATENT DOCUMENTS

| EP | 0748855 A1 | 12/1996 |
|---|---|---|
| JP | 2001-056405 A | 2/2001 |
| JP | 2005-126608 A | 5/2005 |
| JP | 2005-128346 A | 5/2005 |
| JP | 2007-335560 A | 12/2007 |
| JP | 2009-249503 A | 10/2009 |
| WO | WO-96/34922 A1 | 11/1996 |
| WO | WO-2006/109526 A1 | 10/2006 |

OTHER PUBLICATIONS

J. A. Rogers et al., "Printed Plastic Electronics and Paperlike Displays," Journal of Polymer Science: Part A: Polymer Chemistry 2002, vol. 40, pp. 3327-3334.
T. Jung et al., "Moisture induced surface polarization in a poly(4-vinyl phenol) dielectric in an organic thin-film transistor," Applied Physics Letters, 2005, vol. 87, pp. 182109-1-182109-3.
Y. Xia et al., "Soft Lightgraphy," Annual Review of Material Science, 1998, vol. 28, pp. 153-184.
International Search Report dated May 25, 2010, issued on the counterpart PCT Patent Application No. PCT/JP2010/057335 with English translation thereof.
Supplementary European Search Report dated Aug. 31, 2012, issued for the corresponding European patent application No. 10769691.6.

*Primary Examiner* — Patrick Niland
(74) *Attorney, Agent, or Firm* — Edwards Wildman Palmer LLP

(57) ABSTRACT

There is provided an ink composition for forming a light shielding film in an organic semiconductor device which is capable of stably forming a fine pattern when forming a finely patterned light shielding film by the letterpress reverse printing method or microcontact printing method, which can be baked at a temperature equal to or less than the substrate heatproof temperature, and which is also capable of providing light shielding property and mechanical strength, the ink composition for forming a light shielding film in an organic semiconductor device which is an ink composition for forming a light shielding film in an organic semiconductor device comprising a black pigment; a resin component; a surface energy modifier; a quick-drying organic solvent; a slow-drying organic solvent; and a mold releasing agent, wherein the resin component comprises a solid resin that is in a solid state at 200° C. or less and a liquid resin that is in a liquid state at 10 to 50° C. at a ratio (solid resin/liquid resin) of 0.2 to 0.6.

19 Claims, 1 Drawing Sheet

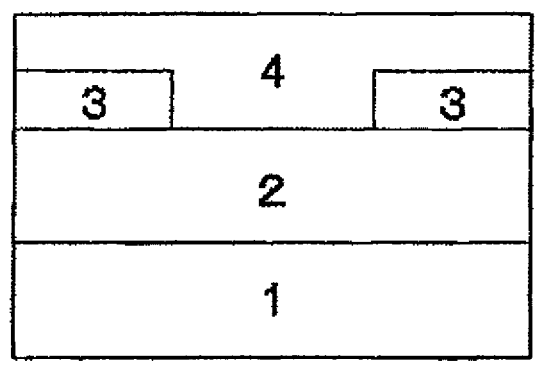

INK COMPOSITION FOR FORMING LIGHT SHIELDING FILM OF ORGANIC SEMICONDUCTOR DEVICE, METHOD FOR FORMING LIGHT SHIELDING FILM, AND ORGANIC TRANSISTOR DEVICE HAVING LIGHT SHIELDING FILM

TECHNICAL FIELD

The present invention relates to an ink composition for forming a light shielding film in an organic semiconductor device which is capable of stably forming a light shielding film that serves as a protective film for the organic semiconductor device by a fine pattern printing process, and a method for forming the light shielding film.

BACKGROUND ART

Transistors have been widely used as important semiconductor electronic devices (electronic parts) which constitute displays and computing devices, and are currently produced by using inorganic materials such as silicon as main raw materials (semiconductor materials). In recent years, "organic transistors" (i.e., organic field effect transistors (OFET)) in which an organic material is used as the semiconductor material for the transistor have been attracting attention (for example, refer to Non-patent Document 1). Not only the OFETs are elastic and can be subjected to a low temperature treatment, and thus a flexible plastic can be used as a substrate, but also they can be produced by a printing method at a low cost, which is a great advantage. Accordingly, the OFETs have been considered as the essential electronic devices for providing indispensable items (such as flexible and low-cost terminals) in the ubiquitous era.

However, as compared to inorganic materials such as silicon, organic semiconductor materials are prone to characteristic changes and deterioration of performance when exposed to light such as visible light and ultraviolet radiation. For this reason, it is necessary to cover a semiconductor device using an organic semiconductor material (including OFETs) with a light shielding protective film. In order to take advantage of the characteristics as an organic transistor, such light shielding films need to be provided through a fine pattern formation on top of a semiconductor layer by a printing method. Moreover, it is necessary to treat the light shielding film so that the drying and curing thereof after the printing are conducted at a temperature equal to or lower than the heatproof temperature of the plastic substrate (i.e., a low-temperature curing light shielding film is required). Furthermore, the light shielding film cured at that temperature needs to exhibit a sufficient level of mechanical strength so as not to be damaged during the joining with a display panel.

Incidentally, a method for forming a light shielding film by applying a water-soluble ink containing carbon black by an ink jet process has been disclosed (for example, refer to Patent Document 1). However, it has been well known that moisture adversely affects the characteristics of OFETs (for example, refer to Non-patent Document 2). On the other hand, also in those cases where an organic solvent-based ink is used for the formation of a light shielding film, the semiconductor layer may be separated by the organic solvent. As described above, when different layers were successively printed by the conventional printing method, printing of the upper layer adversely affects the lower layer.

As a method for resolving such problems, a letterpress reverse printing method or a microcontact printing method is available (for example, refer to Non-patent Document 3). In these printing methods, not only a fine pattern can be formed, but also the lower layer is hardly affected even if an overprinting process is conducted, since an ink is applied onto an elastomeric blanket or an elastomeric stamp, and printing on a substrate is carried out after rapidly increasing the ink viscosity thereon.

However, mixing of a special ink is required in order to stably form a light shielding film for an organic semiconductor device by fine pattern printing while achieving the aforementioned various properties, that is, the light shielding property, the low-temperature curing property (curing at a temperature equal to or less than the substrate heatproof temperature), and the mechanical strength of coating film after curing by these methods.

It has been known that the following characteristics are required for the ink in order to form a fine and precise printing pattern by the letterpress reverse printing method. It is required that an ink composition have sufficient levels of viscosity and surface energy so as to be able to form a uniform ink coating film on the blanket, and exhibit sufficient levels of drying property, adhesiveness, and cohesive strength so that a complete printing pattern can be formed on top of the blanket by the time a printing pattern is formed by the contact with the letterpress plate. Moreover, the ink composition serving as a fine patterning ink composition is provided with sufficient levels of adhesiveness and cohesive strength that enable the ink coating film on the blanket to be transferred completely to a printing substrate, preferably with an ink viscosity of 5 mPa·s or less and a surface energy of 25 mN/m or less. As the ink satisfying the characteristics described above, an ink composition containing a volatile solvent, a resin that is soluble in this volatile solvent and a solid that is insoluble in this volatile solvent, and in which the volatile solvent is a mixture of a quick-drying solvent and a slow-drying solvent has been disclosed (for example, refer to Patent Documents 3 and 4). However, although Patent Documents 3 and 4 provide a detailed disclosure of an ink composition required for forming a precision pattern by the letterpress reverse printing method, there is no disclosure of a composition required for providing the aforementioned properties to the light shielding film formed with ink for forming a light shielding pattern.

Non-patent Document 1: Journal of Polymer Science: Part A: Polymer Chemistry 2002, vol. 40, pp. 3327
Non-patent Document 2: Applied Physics Letters, 2005, vol. 87, pp. 182109
Non-patent Document 3: Annual Review of Material Science, 1998, vol. 28, pp. 153
Patent Document 1: Japanese Unexamined Patent Application, First Publication No. 2007-335560
Patent Document 2: Japanese Unexamined Patent Application, First Publication No. 2001-56405
Patent Document 3: Japanese Unexamined Patent Application, First Publication No. 2005-126608
Patent Document 4: Japanese Unexamined Patent Application, First Publication No. 2005-128346

DISCLOSURE OF INVENTION

Problems to be Solved by the Invention

An object of the present invention is to provide an ink composition for forming a light shielding film in an organic semiconductor device which is capable of stably forming a fine pattern when forming a finely patterned light shielding film by the letterpress reverse printing method or microcontact printing method, which can be baked at a temperature equal to or less than the substrate heatproof temperature, and which is also capable of providing light shielding property and mechanical strength.

Means for Solving the Problems

In order to solve the above-mentioned problems, the present inventors have conducted intensive and extensive studies, and as a result, the present invention is completed by examining the resin components in the ink used for the letterpress reverse printing.

That is, firstly, the present invention provides an ink composition for forming a light shielding film in an organic semiconductor device which is an ink composition for forming a light shielding film in an organic semiconductor device which contains a black pigment, a resin component, a surface energy modifier, a quick-drying organic solvent having a vapor pressure at 20° C. of $11.3 \times 10^2$ Pa (8.0 mmHg) or more and a boiling point under one atmospheric pressure of less than 115° C., a slow-drying organic solvent having a vapor pressure at 20° C. of less than $11.3 \times 10^2$ Pa (8.0 mmHg) and a boiling point under one atmospheric pressure of 115° C. or more, and a mold releasing agent, and characterized in that the resin component contains a solid resin that is in a solid state at 200° C. or less and a liquid resin that is in a liquid state at 10 to 50° C. at a ratio (solid resin/liquid resin) of 0.2 to 0.6.

The present invention secondly provides a method for forming a light shielding film in an organic semiconductor device which is a method for forming a light shielding film in an organic semiconductor device by forming a light shielding film patterned using a printing method on top of the organic semiconductor device, the method characterized in that the ink used in the printing method is an ink composition for forming a light shielding film in an organic semiconductor device which contains a black pigment, a resin component, a surface energy modifier, a quick-drying organic solvent having a vapor pressure at 20° C. of $11.3 \times 10^2$ Pa (8.0 mmHg) or more and a boiling point under one atmospheric pressure of less than 115° C., a slow-drying organic solvent having a vapor pressure at 20° C. of less than $11.3 \times 10^2$ Pa (8.0 mmHg) and a boiling point under one atmospheric pressure of 115° C. or more, and a mold releasing agent, wherein the resin component contains a solid resin that is in a solid state at 200° C. or less and a liquid resin that is in a liquid state at 10 to 50° C. at a ratio (solid resin/liquid resin) of 0.2 to 0.6; and the printing method is either a letterpress reverse printing method or a microcontact printing method.

Effects of the Invention

By using the ink composition of the present invention for forming a light shielding film in an organic semiconductor device and employing a printing method (either a letterpress reverse printing method or a microcontact printing method) via an elastomeric blanket or an elastomeric stamp, a finely patterned light shielding film which can be baked at a temperature equal to or less than the substrate heatproof temperature and which exhibits sufficient levels of light shielding property and mechanical strength can stably be formed on top of the organic semiconductor device.

BEST MODE FOR CARRYING OUT THE INVENTION

A first embodiment of the present invention is an ink composition for forming a light shielding film in an organic semiconductor device which is an ink composition for forming a light shielding film in an organic semiconductor device which contains a black pigment, a resin component, a surface energy modifier, a quick-drying organic solvent having a vapor pressure at 20° C. of $11.3 \times 10^2$ Pa (8.0 mmHg) or more and a boiling point under one atmospheric pressure of less than 115° C., a slow-drying organic solvent having a vapor pressure at 20° C. of less than $11.3 \times 10^2$ Pa (8.0 mmHg) and a boiling point under one atmospheric pressure of 115° C. or more and a mold releasing agent, and characterized in that the resin component contains a solid resin that is in a solid state at 200° C. or less and a liquid resin that is in a liquid state at 10 to 50° C. at a ratio (solid resin/liquid resin) of 0.2 to 0.6.

Among the aforementioned resin components, the solid resin that is in a solid state at 200° C. or less is preferably at least one kind of a thermosetting resin selected from the group consisting of polyester-based resins, acrylic resins, epoxy-based resins, melamine-based resins, benzoguanamine-based resins, vinyl-based resins, phenol-based resins and urethane-based resins. Polyvinylphenol (PVP), among the vinyl-based resins, is particularly preferred in view of the rigidity and crosslinking curability thereof.

Among the aforementioned resin components, the liquid resin that is in a liquid state at 10 to 50° C. is preferably at least one kind of a thermosetting resin selected from the group consisting of polyester-based resins, acrylic resins, epoxy-based resins, melamine-based resins, benzoguanamine-based resins, vinyl-based resins and isocyanate-based resins. Epoxy resins are particularly preferred in view of their printability and crosslinking reactivity with a crosslinkable thermoplastic resin.

The aforementioned ratio of the contained solid resin and liquid resin (i.e., (solid resin)/(liquid resin)) is preferably within a range from 0.2 to 0.6, and more preferably within a range from 0.25 to 0.5. The ratio within this range is more preferable in view of forming a fine line pattern. When the ratio falls outside this range, there is a trend in that the ink dispersibility deteriorates and the fine line pattern thickens.

As the black pigments used in the ink composition of the present invention for forming a light shielding film in an organic semiconductor device, carbon black, a copper/iron/manganese based composite oxides, tricobalt tetraoxide produced from cobalt oxide as the starting material, magnetite-based black, copper/iron/manganese-based black and titanium black are used, and titanium black is particularly preferred. Examples of the titanium black include a titanium black dispersion manufactured by Mitsubishi Chemical Corporation.

The ratio of the contained black pigment and resin component (i.e., (black pigment)/(resin component)) is preferably within a range from 1.5 to 4, and more preferably within a range from 2 to 3. When the ratio is within this range, an excellent balance between the light shielding property and mechanical strength can be achieved. The ratio lower than the value within this range tends to result in the deterioration of light shielding property, whereas the ratio higher than the value within this range tends to result in the deterioration of mechanical strength.

As the quick-drying solvent used in the ink composition of the present invention for forming a light shielding film in an organic semiconductor device, at least any one of ester-based solvents, alcohol-based solvents, ether-based solvents and hydrocarbon-based solvents which exhibit a vapor pressure at 20° C. of $11.3 \times 10^2$ Pa (8.0 mmHg) or more and a boiling point under atmospheric pressure of less than 115° C. is used.

Examples of the ester-based solvents include ethyl acetate, normal propyl acetate and isopropyl acetate; examples of the alcohol-based solvents include methanol, ethanol, 1-propanol and 2-propanol; and examples of hydrocarbon-based solvents include pentane, hexane, cyclohexane, methylcyclohexane, toluene and xylene. In addition, these solvents may be a mixture of solvents based on the same group of compounds or may be a mixture of solvents based on different group of compounds. Of these, isopropyl acetate, ethanol and 2-propanol are preferred in view of the evaporation rate and surface tension thereof.

The total amount of the aforementioned quick-drying solvents in the ink composition is preferably within a range from 5 to 90% by mass.

As the slow-drying solvent used in the ink composition of the present invention for forming a light shielding film in an organic semiconductor device, at least any one of ester-based solvents, alcohol-based solvents, ether-based solvents and hydrocarbon-based solvents which exhibit a vapor pressure at 20° C. of less than $11.3 \times 10^2$ Pa (8.0 mmHg) and a boiling point under atmospheric pressure of 115° C. or more is used.

Examples of the ester-based solvents include propylene glycol monomethyl ether acetate (PGMAc), 3-methoxy-3-methylbutyl acetate ("Solfit Ac" (product name), manufactured by Kuraray Co., Ltd.) and ethoxyethyl propionate (EEP), and examples of the alcohol-based solvents include 1-butanol, Diadol 135 (product name, manufactured by Mitsubishi Rayon Co., Ltd.), 3-methoxy-3-methyl-1-butanol, 1-hexanol, 1,3-butanediol, 1-pentanol, 2-methyl-1-butanol, 4-methyl-2-pentanol and propylene carbonate.

Examples of the ether-based solvents include propylene glycol monomethyl ether, propylene glycol monoethyl ether, propylene glycol monopropyl ether, propylene glycol tertiary butyl ether, dipropylene glycol monomethyl ether, ethylene glycol butyl ether, ethylene glycol ethyl ether, ethylene glycol methyl ether, diethylene glycol butyl ether, and diethylene glycol ethyl ether.

Examples of the hydrocarbon-based solvents include Solvesso 100 and Solvesso 150 (product names, manufactured by ExxonMobil Chemical Company), and N-methylpyrrolidone. In addition, these solvents may be a mixture of solvents based on the same group of compounds or may be a mixture of solvents based on the different group of compounds.

Of these, propylene glycol monomethyl ether acetate, 3-methoxy-3-methylbutyl acetate, ethoxyethyl propionate, propylene glycol monomethyl ether, propylene glycol monopropyl ether and Diadol 135 are preferred in view of the evaporation rate and surface tension thereof.

The total amount of the aforementioned slow-drying solvents in the ink composition is preferably within a range from 5 to 90% by mass.

It is preferable that the ink composition of the present invention includes a surface energy modifier. This surface energy modifier is added in order to adjust the surface energy of the ink composition lower than the surface energy of the blanket surface so that the ink composition can be applied uniformly in a favorable manner on the blanket surface.

This surface energy modifier uses at least one kind of a fluorine-based surface active agent, and is included within a range from 0.05 to 5.0% by mass, preferably within a range from 0.1 to 1.0% by mass, with respect to the total ink composition. As a result, at the time of coating the ink onto the blanket, the smoothness of the coating film is improved, thereby yielding a more uniform coating film.

If the content thereof is low and falls outside this range, the ink repellency occurs on the blanket or the ink coating film is no longer uniform and becomes uneven, which is undesirable. On the other hand, if the content thereof is in excess, the surface energy modifier in the ink coating film inhibits the adhesion between the printed substrate and the ink coating film following the transfer onto the substrate, which is also undesirable.

More specifically, as the surface energy modifier, at least one of Megafac TF1303, Megafac TF1159, Megafac TF1177, Megafac F-470, Megafac F-472 and Megafac F-484 (all of which are product names and manufactured by DIC Corporation) is used.

It is preferable that the ink composition of the present invention further includes a mold releasing agent. At least one kind of a known silicone-based compound which has been commonly used is used as the mold releasing agent. Specific examples thereof include dimethyl silicone oil, dimethyl silicone rubber, silicone resin, organic modified silicone, methylphenyl silicone oil, long-chain alkyl-modified silicone oil, mixtures of a fluorine compound and a silicone polymer and fluorine-modified silicone, although the silicone-based compound is not particularly limited thereto. In addition, these silicone-based compounds may be used alone, or two or more types thereof may be used in combination. Of these, series of silicone-based compounds; i.e., Granol (manufactured by Kyoeisha Chemical Co., Ltd.) and KF-961, (manufactured by Shin-Etsu Chemical Co., Ltd.) are preferred in view of the mold release properties and the compatibility with a solid resin. These mold releasing agents are included within a range from 0.0 to 5.0% by mass, preferably within a range from 0.0 to 1.0% by mass, with respect to the total ink composition. If the content thereof is in excess and falls outside this range, not only the printability deteriorates but also the insulating properties are impaired, which is undesirable.

In the ink of the present invention, if necessary, a leveling agent, a dispersant, an antifoaming agent or the like can be further added as an optional component.

A second embodiment of the present invention is a method for forming a light shielding film in an organic semiconductor device. The method is a method for forming a light shielding film in an organic semiconductor device by forming a light shielding film patterned using a printing method on top of the patterned organic semiconductor device, the method characterized in that the ink used in the printing method is an ink composition for forming a light shielding film in an organic semiconductor device which contains a black pigment, a resin component, a surface energy modifier, a quick-drying organic solvent having a vapor pressure at 20° C. of $11.3 \times 10^2$ Pa (8.0 mmHg) or more and a boiling point under one atmospheric pressure of less than 115° C., a slow-drying organic solvent having a vapor pressure at 20° C. of less than $11.3 \times 10^2$ Pa (8.0 mmHg) and a boiling point under one atmospheric pressure of 115° C. or more, and a mold releasing agent, wherein the resin component contains a solid resin that is in a solid state at 200° C. or less and a liquid resin that is in a liquid state at 10 to 50° C. at a ratio (solid resin/liquid resin) of 0.2 to 0.6; and the printing method is either a letterpress reverse printing method or a microcontact printing method.

The letterpress reverse printing method is a method in which ink is coated onto a smooth, mold releasing surface constituted of an elastomer such as polydimethylsiloxane (PDMS), a letterpress printing plate serving as a cutting die is pressed against the ink coated surface, an ink portion that is in contact with the letterpress printing plate is removed from the mold releasing surface, and the remaining pattern is reversely transferred to the printing body.

The microcontact printing method is a printing method by applying ink onto a letterpress printing plate constituted of an elastomer such as polydimethylsiloxane (PDMS) and pressing this against the printing body.

EXAMPLES

Next, the present invention will be described in more detail using a series of examples. It should be noted that the terms "parts" and "%" used in the present specification are based on the mass unless stated otherwise. The ink compositions, printed matter for tests and evaluation results of Example and Comparative Example are shown in Table 1.
(Preparation of Ink (1))
60.87 g of titanium black (manufactured by Mitsubishi Chemical Corporation) as a black pigment, 1.08 g of Maruka Lyncur M (manufactured by Maruzen Petrochemical Co., Ltd., hereafter referred to as PVP) as a solid resin, 3.60 g of Epiclon 850CPR (manufactured by DIC Corporation, hereafter referred to as 850CRP) as a liquid resin, 0.13 g of 2-ethyl-4-methylimidazole (hereafter, referred to as 2E4MZ) as a crosslinking auxiliary agent, 9.04 g of isopropyl acetate (hereafter, referred to as IPAc) as a solvent, 7.34 g of propylene glycol monomethyl ether (hereafter, referred to as PGM), 10.03 g of propylene glycol monopropyl ether (hereafter, referred to as PNP), 3.60 g of propylene glycol monomethyl ether acetate (hereafter, referred to as PGMAc), 2.89 g of propylene carbonate (hereafter, referred to as PC), 0.37 g of Megafac TF1159 (hereafter, referred to as TF1159) and 0.48 g of Megafac TF1177 (hereafter, referred to as TF1177) as surface energy modifiers, and 0.13 g of Granol 1484 (hereafter, referred to as G1484) and 0.44 g of KF-96L2cs as mold releasing agents were mixed to prepare ink (1).
(Preparation of Ink (2))
62.99 g of titanium black (manufactured by Mitsubishi Chemical Corporation) as a black pigment, 1.12 g of PVP as a solid resin, 3.73 g of 850CRP as a liquid resin, 0.13 g of 2E4MZ as a crosslinking auxiliary agent, 9.34 g of IPAc as a solvent, 7.60 g of PGM, 10.38 g of PNP, 3.73 g of PGMAc, 0.38 g of TF1159 as a surface energy modifier, and 0.14 g of 01484 and 0.46 g of KF-96L2cs as mold releasing agents were mixed to prepare ink (2).
(Preparation of Each Ink)
Each ink was prepared with the compositions shown in Table 1 in the same manner as that in the aforementioned ink (1) and (2).

TABLE 1

|  | Ink (1) | Ink (2) | Ink (3) | Ink (4) | Ink (5) |
| --- | --- | --- | --- | --- | --- |
| Black pigment | 60.87 | 62.99 | 62.06 | 64.3 | 61.35 |
| PVP | 1.08 | 1.12 | 1.59 | 0.45 | 1.94 |
| 850CRP | 3.6 | 3.73 | 3.18 | 4.5 | 2.8 |
| 2E4MZ | 0.13 | 0.13 | 0.13 | 0.13 | 0.13 |
| G1484 | 0.13 | 0.14 | 0.14 | 0.14 | 0.13 |
| KF96L2cs | 0.44 | 0.46 | 0.45 | 0.47 | 0.45 |
| TF1159 | 0.37 | 0.38 | 0.38 | 0.39 | 0.37 |
| TF1177 | 0.48 | 0 | 0 | 0 | 0 |
| IPAc | 9.04 | 9.34 | 10.67 | 7.45 | 11.68 |
| PGM | 7.34 | 7.6 | 7.49 | 7.76 | 7.4 |
| PNP | 10.03 | 10.38 | 10.23 | 10.60 | 10.11 |
| PGMAc | 3.6 | 3.73 | 3.68 | 3.81 | 3.63 |
| PC | 2.89 | 0 | 0 | 0 | 0 |
| Total | 100 | 100 | 100 | 100 | 100 |
| Black pigment/resin | 2.09 | 2.09 | 2.09 | 2.09 | 2.05 |
| Solid resin/Liquid resin | 0.3 | 0.3 | 0.5 | 0.1 | 0.7 |

(Evaluation of Ink Dispersibility)
After the preparation of ink by mixing, the ink was passed through a filter made of polytetrafluoroethylene and having a pore size of 0.45 μm (manufactured by Target Corporation), and the dispersibility of that ink was evaluated. The dispersibility was rated as fair (o) when the ink had passed through the filter, and was rated as poor (x) when the ink had failed to pass through the filter.
(Pattern Printability)
A coating film of that ink was formed on the PDMS surface of the blanket made of an elastomer, and a letterpress printing plate made of glass and having a lattice pattern with a line width of 20 μm to be served as a cutting die was pressed against the coating film. Then excess ink was removed to form a pattern on top of the blanket, followed by the transfer of the pattern to a glass plate serving as a printing substrate, thereby forming an image. The quality of the image formed on top of this glass plate was observed by an optical microscope to evaluate whether the above-mentioned pattern of the letterpress printing plate was precisely reproduced.
(Light Shielding Property and Optical Density Value after Curing at 160° C.)
A coating film of that ink was formed on the PDMS surface of the blanket made of an elastomer, and this was transferred to a glass plate serving as a printing substrate, thereby forming a solid coating film. The resultant was baked at 160° C. for 1 hour, and the optical density of the coating film was evaluated using an optical density evaluation apparatus.
(Mechanical Strength after Curing at 160° C.)
A coating film of that ink was formed on the PDMS surface of the blanket made of an elastomer, and this was transferred to a glass plate serving as a printing substrate, thereby forming a solid coating film. The resultant was baked at 160° C. for 1 hour and then rubbed with Kimwipe, and the mechanical strength after the curing at 160° C. was evaluated by observing whether the baked coating film came off. The results of the evaluations described above are shown in Table 2.

TABLE 2

|  | Ink (1) | Ink (2) | Ink (3) | Ink (4) | Ink (5) |
| --- | --- | --- | --- | --- | --- |
| Ink property: dispersibility | o | o | o | x | x |
| Pattern printability | o | o | o | — | — |
| Mechanical strength after curing at 160° C. | o | o | o | — | — |
| Optical density after curing at 160° C. | 4 | 4 | 4 | — | — |

From these results, it became clear that the ink composition of the present invention is an ink composition capable of stably forming a light shielding film by a fine pattern printing process.
(Preparation and Evaluation of Transistor)
A device having a structure shown in FIG. 1 was formed. A silicon substrate (1) attached with a thermally oxidized film was used as a substrate, and a chlorobenzene solution (5 mg/mL) of poly(2-methoxy-5-(2'-ethylhexyloxy)-1,4-phenylenevinylene (manufactured by Sigma-Aldrich Corporation; hereafter referred to as MEHPPV) was spin coated on the surface of the substrate, thereby preparing an MEHPPV layer (2). Then, using a metal mask, an Au electrode (3) was patterned and formed with a thickness of 30 nm and an interval of 75 μm, thereby preparing an organic transistor device. The light shielding, ink coating film formed on the PDMS surface of the blanket made of an elastomer was pressed against and transferred onto this organic transistor, thereby covering the organic transistor with a light shielding, solid ink coating film. With respect to the transistor device obtained in the manner as mentioned above, the measurement of the transistor characteristics was carried out in a dark room or in a room under a fluorescent lamp by applying a sweep voltage (Vg) of 0 to −80V to silicon using a digital multimeter (model 237, manufactured by Keithley Instruments, Inc.) and measuring the current (Id) flowing between the Au electrode (3) which had been applied a voltage of −80V. The mobility was determined by a known method from the slope of the square root ($\sqrt{}$) of Id–Vg. The ON/OFF ratio was determined from the ratio ((the maximum Id value)/(the minimum Id value)). The evaluation results are shown in Table 3.

TABLE 3

| | | No light shielding film | Ink (1) | Ink (2) | Ink (3) |
|---|---|---|---|---|---|
| Mobility | Dark room | 0.0004 | 0.0003 | 0.0004 | 0.0003 |
| | Room under fluorescent lamp | 0.0007 | 0.0003 | 0.0004 | 0.0003 |
| ON/OFF | Dark room | $10^3$ | $10^3$ | $10^3$ | $10^3$ |
| | Room under fluorescent lamp | $10^2$ | $10^3$ | $10^3$ | $10^3$ |

From these results, it is clear that the ink composition of the present invention is an ink composition for forming a light shielding film in an organic semiconductor device which is capable of stably forming a light shielding film that serves as a protective film for the organic semiconductor device by a fine pattern printing process.

INDUSTRIAL APPLICABILITY

By using the ink composition of the present invention for forming a light shielding film in an organic semiconductor device in combination with a letterpress reverse printing method or a microcontact printing method, it becomes possible to stably form an organic semiconductor device capable of providing sufficient levels of light shielding property and mechanical strength, and thus the wide spread of organic semiconductor devices can be expected.

BRIEF DESCRIPTION OF THE DRAWINGS

FIG. 1 is a schematic diagram of a semiconductor device shielded by ink for forming a light shielding film of the present invention.

DESCRIPTION OF THE REFERENCE SYMBOLS

1. Substrate
2. Organic semiconductor layer
3. Electrode
4. Light shielding film

The invention claimed is:
1. An ink composition for forming a light shielding film in an organic semiconductor device, the ink composition comprises:
   a black pigment;
   a resin component;
   a surface energy modifier;
   a quick-drying organic solvent having a vapor pressure at 20° C. of $11.3 \times 10^2$ Pa (8.0 mmHg) or more and a boiling point under one atmospheric pressure of less than 115° C.;
   a slow-drying organic solvent having a vapor pressure at 20° C. of less than $11.3 \times 10^2$ Pa (8.0 mmHg) and a boiling point under one atmospheric pressure of 115° C. or more; and
   a mold releasing agent,
   wherein the resin component contains a solid resin that is in a solid state at 200° C. or less and a liquid resin that is in a liquid state at 10 to 50° C. at a ratio (solid resin/liquid resin) of 0.2 to 0.6 by mass.

2. The ink composition for forming a light shielding film in an organic semiconductor device according to claim 1, wherein the solid resin comprises at least one kind of a thermoplastic resin selected from the group consisting of polyester-based resins, acrylic resins, epoxy-based resins, melamine-based resins, benzoguanamine-based resins, vinyl-based resins, phenol-based resins and urethane-based resins.

3. The ink composition for forming a light shielding film in an organic semiconductor device according to claim 1, wherein the liquid resin comprises at least one kind of a thermosetting resin selected from the group consisting of polyester-based resins, acrylic resins, epoxy-based resins, melamine-based resins, benzoguanamine-based resins, vinyl-based resins and isocyanate-based resins.

4. The ink composition for forming a light shielding film in an organic semiconductor device according to claim 1, wherein the black pigment is titanium black.

5. The ink composition for forming a light shielding film in an organic semiconductor device according to claim 1, wherein a ratio of the contained black pigment and resin component (black pigment/resin component) is within a range from 1.5 to 4 by mass.

6. The ink composition for forming a light shielding film in an organic semiconductor device according to claim 1, wherein the quick-drying organic solvent is at least one kind of solvent selected from ester-based solvents, alcohol-based solvents, ether-based solvents and hydrocarbon-based solvents, and
   a total amount of the quick-drying organic solvents in the ink composition is within a range from 5 to 90% by mass.

7. The ink composition for forming a light shielding film in an organic semiconductor device according to claim 1, wherein the slow-drying organic solvent is at least one kind of solvent selected from ester-based solvents, alcohol-based solvents, ether-based solvents and hydrocarbon-based solvents, and
   a total amount of the slow-drying organic solvents in the ink composition is within a range from 5 to 90% by mass.

8. The ink composition for forming a light shielding film in an organic semiconductor device according to claim 1, wherein the surface energy modifier is a fluorine-based surface active agent and is included in the ink composition within a range from 0.05 to 5.0% by mass.

9. A method for forming a light shielding film in an organic semiconductor device, the method comprises a step of forming a light shielding film patterned using a printing method on top of the organic semiconductor device,
   wherein ink used in the printing method is an ink composition for forming a light shielding film in an organic semiconductor device which comprises a black pigment, a resin component, a surface energy modifier, a quick-drying organic solvent having a vapor pressure at 20° C. of $11.3 \times 10^2$ Pa (8.0 mmHg) or more and a boiling point under one atmospheric pressure of less than 115° C., a slow-drying organic solvent having a vapor pressure at 20° C. of less than 11.3×10² Pa (8.0 mmHg) and a boiling point under one atmospheric pressure of 115° C. or more, and a mold releasing agent, wherein the resin component comprises a solid resin that is in a solid state at 200° C. or less and a liquid resin that is in a liquid state at 10 to 50° C. at a ratio (solid resin/liquid resin) of 0.2 to 0.6 by mass; and the printing method is either a letterpress reverse printing method or a microcontact printing method.

10. An organic transistor device comprising a light shielding film formed by the method of claim 9.

11. The ink composition for forming a light shielding film in an organic semiconductor device according to claim 2, wherein the liquid resin comprises at least one kind of a thermosetting resin selected from the group consisting of polyester-based resins, acrylic resins, epoxy-based resins, melamine-based resins, benzoguanamine-based resins, vinyl-based resins and isocyanate-based resins.

12. The ink composition for forming a light shielding film in an organic semiconductor device according to claim 2, wherein the black pigment is titanium black.

13. The ink composition for forming a light shielding film in an organic semiconductor device according to claim 11, wherein the black pigment is titanium black.

14. The ink composition for forming a light shielding film in an organic semiconductor device according to claim 4, wherein a ratio of the contained black pigment and resin component (black pigment/resin component) is within a range from 1.5 to 4 by mass.

15. The ink composition for forming a light shielding film in an organic semiconductor device according to claim 11, wherein a ratio of the contained black pigment and resin component (black pigment/resin component) is within a range from 1.5 to 4 by mass.

16. The ink composition for forming a light shielding film in an organic semiconductor device according to claim 13, wherein a ratio of the contained black pigment and resin component (black pigment/resin component) is within a range from 1.5 to 4 by mass.

17. The ink composition for forming a light shielding film in an organic semiconductor device according to claim 16, wherein the quick-drying organic solvent is at least one kind of solvent selected from ester-based solvents, alcohol-based solvents, ether-based solvents and hydrocarbon-based solvents, and a total amount of the quick-drying organic solvents in the ink composition is within a range from 5 to 90% by mass.

18. The ink composition for forming a light shielding film in an organic semiconductor device according to claim 17, wherein the slow-drying organic solvent is at least one kind of solvent selected from ester-based solvents, alcohol-based solvents, ether-based solvents and hydrocarbon-based solvents, and a total amount of the slow-drying organic solvents in the ink composition is within a range from 5 to 90% by mass.

19. The ink composition for forming a light shielding film in an organic semiconductor device according to claim 18, wherein the surface energy modifier is a fluorine-based surface active agent and is included in the ink composition within a range from 0.05 to 5.0% by mass.

* * * * *